United States Patent
Saito et al.

(10) Patent No.: US 8,963,346 B2
(45) Date of Patent: Feb. 24, 2015

(54) SEMICONDUCTOR WAFER AND SEMICONDUCTOR DEVICE

(71) Applicant: Olympus Corporation, Tokyo (JP)

(72) Inventors: Haruhisa Saito, Tokyo (JP); Yoshitaka Tadaki, Hanno (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/845,597

(22) Filed: Mar. 18, 2013

(65) Prior Publication Data
US 2013/0256839 A1    Oct. 3, 2013

(30) Foreign Application Priority Data
Mar. 30, 2012  (JP) .................................. 2012-081931

(51) Int. Cl.
*H01L 23/544*    (2006.01)
*H01L 21/02*    (2006.01)

(52) U.S. Cl.
CPC ........ *H01L 23/544* (2013.01); *H01L 21/02002* (2013.01); *H01L 2223/54426* (2013.01); *H01L 2223/54433* (2013.01); *H01L 2223/54493* (2013.01)

USPC .......................................................... 257/797

(58) Field of Classification Search
CPC .................. H01L 21/02002; H01L 23/544
USPC .......................................................... 257/797
See application file for complete search history.

(56) References Cited

U.S. PATENT DOCUMENTS

| | | | |
|---|---|---|---|
| 5,800,906 A * | 9/1998 | Lee et al. | 428/192 |
| 6,235,637 B1 * | 5/2001 | Chen et al. | 438/694 |
| 7,390,723 B2 * | 6/2008 | Chen | 438/401 |

FOREIGN PATENT DOCUMENTS

JP    11-233389 A    8/1999

* cited by examiner

*Primary Examiner* — Phat X Cao
(74) *Attorney, Agent, or Firm* — Westerman, Hattori, Daniels & Adrian, LLP

(57) ABSTRACT

A semiconductor wafer may include: a disk-shaped wafer body made of silicon; and an identification trench section having at least one trench and provided at a periphery section of the wafer body, wherein the trench is opened in the periphery of the wafer body, and has a depth less than a thickness of the wafer body.

4 Claims, 3 Drawing Sheets

SEMICONDUCTOR WAFER AND SEMICONDUCTOR DEVICE

BACKGROUND OF THE INVENTION

1. Field of the Invention

The present invention relates to a semiconductor wafer, and more specifically, to a semiconductor wafer suitably usable for wafer direct bonding and a semiconductor device using the semiconductor wafer.

Priority is claimed on Japanese Patent Application No. 2012-081931, filed Mar. 30, 2012, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

In order to enable a silicon wafer to be identified, forming a specific shape such as an oriental flat or a notch on a periphery section of a wafer (for example, see Japanese Unexamined Patent Application, First Publication No. H11-233389) or engraving with a lot number or a wafer number using a laser is conventionally known. The oriental flat or the notch is used for positioning a wafer mainly in a photolithography process or a probe process. Engraving using a laser is used to identify a wafer for each process by engraving with a lot number and a wafer number on a front surface or a rear surface of a wafer.

SUMMARY

A semiconductor wafer in accordance with a preferred embodiment of the present invention may include: a disk-shaped wafer body made of silicon; and an identification trench section having at least one trench and provided at a periphery section of the wafer body, wherein the trench is opened in the periphery of the wafer body, and has a depth less than a thickness of the wafer body.

The trench may be opened on one surface in a thickness direction of the wafer body, the surface being a bonded surface to be bonded with another semiconductor wafer.

The identification trench section may include: a type indicating section for indicating information on a type of the semiconductor wafer; and a numerical information indicating section for indicating numerical information on the wafer body.

The numerical information indicating section may have a plurality of areas, and indicate the numerical information in the binary system according to presence or absence of a trench for each area.

A semiconductor device in accordance with a preferred embodiment of the present invention is formed by integrally bonding a first wafer and a second wafer that are the semiconductor wafers of the present invention, wherein an arrangement order of a type indicating section and a numerical information indicating section in an identification trench section of the second wafer is reverse to an arrangement order of a type indicating section and a numerical information indicating section in an identification trench section of the first wafer, and the first wafer and the second wafer are bonded so that a phase of the identification trench section of the second wafer coincides with a phase of the identification trench section of the first wafer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
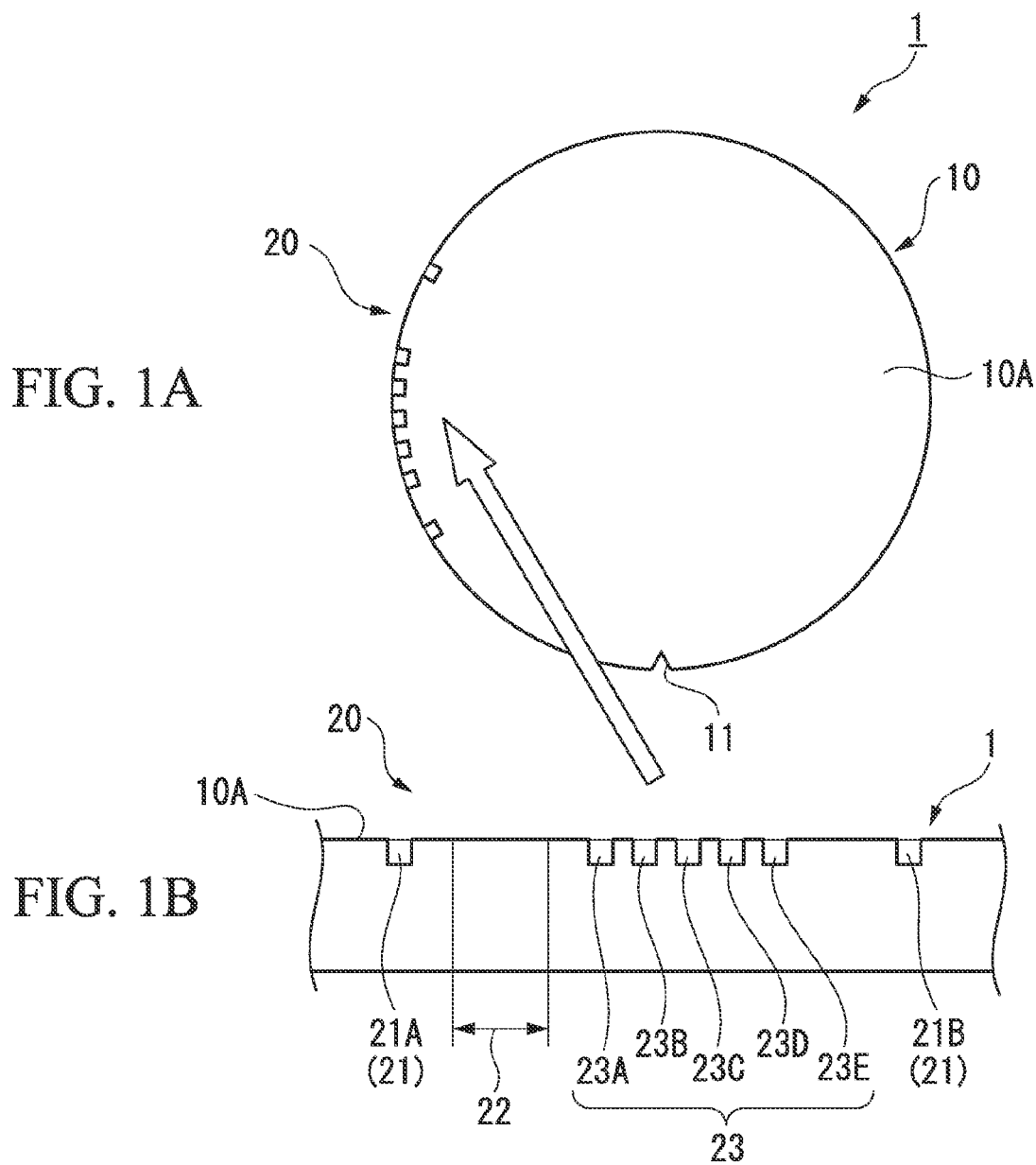
FIG. 1A is a front view illustrating a first wafer in accordance with the first preferred embodiment of the present invention.
FIG. 1B is a partially enlarged view of the periphery of the first wafer in accordance with the first preferred embodiment of the present invention.
Figure 2:
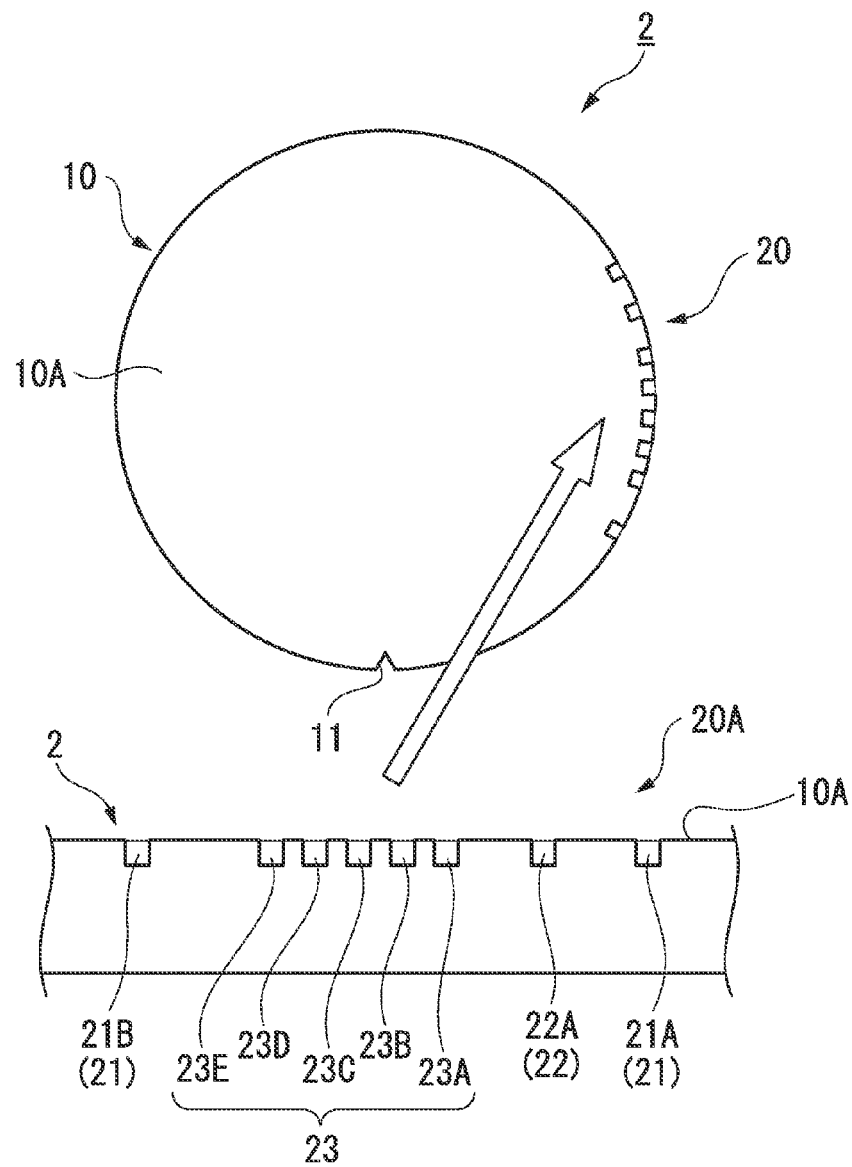
FIG. 2A is a front view illustrating a second wafer in accordance with the first preferred embodiment of the present invention.
FIG. 2B is a partially enlarged view of a periphery of the second wafer in accordance with the first preferred embodiment of the present invention.

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

A first preferred embodiment of the present invention will be described with reference to FIG. 1A to FIG. 3.

FIG. 1A is a front view illustrating a first wafer 1 which is a semiconductor wafer in accordance with the first preferred embodiment of the present invention. The first wafer 1 includes a disk-shaped wafer body 10 made of silicon and an identification trench section 20 formed on a periphery of the wafer body 10.

In the wafer body 10, one surface in a thickness direction of the wafer body 10 is a bonded surface 10A, and a plurality of electrodes and wirings connected to the corresponding electrodes which are not shown are formed in a predetermined area on the bonded surface 10A. This makes the first wafer 1 function as a wiring substrate as a whole. Moreover, a notch 11 for positioning is formed in one place of the periphery of the wafer body 10.

FIG. 1B is a partially enlarged view of the periphery of the first wafer 1. The identification trench section 20 includes a plurality of trenches opened in the bonded surface 10A and the periphery of the wafer body 10 and includes a range indicating section 21, a type indicating section 22 and an identification number indicating section (numerical information indicating section) 23.

The range indicating section 21 indicates a range of the identification trench section 20, and includes a starting trench 21A and an ending trench 21B. The type indicating section 22 indicates a type of a wafer using presence or absence of a trench. In this preferred embodiment, the type indicating section 22 is used to indicate whether a wafer is a photo-diode (PD) side wafer on which a semiconductor element is formed or a read-out (RO) side wafer on which only a wiring is formed without a semiconductor element. In the case of the PD side wafer, a trench is formed in the type indicating section 22. Since the first wafer 1 is the RO side wafer, no trench is formed in the type indicating section 22.

The identification number indicating section 23 indicates an identification number of a wafer which is one of numerical information about a wafer body, and has five areas 23A, 23B, 23C, 23D and 23E in which a trench can be formed. The identification number indicating section 23 indicates digits in which presence of a trench is represented as 1, absence of a trench is represented as 0, and a trench close to the type indicating section 22 is set as the least significant bit in each area to indicate an identification number (usually from 1 to 25) of the wafer in a binary system. In the figures, a trench is formed in every area of the identification number indicating section 23 in order to recognize each area easily.

FIG. 2A is a front view of a second wafer 2 which is bonded with the first wafer 1 by wafer direct bonding. FIG. 2B is a partially enlarged view of a periphery of the second wafer 2.

The second wafer 2 has a wafer body 10 like the first wafer 1. However the second wafer 2 is different from the first wafer 1 in that the second wafer 2 is the PD side wafer which is provided with many semiconductor elements (not shown) as pixels on the bonded surface 10A in addition to an electrode and a wiring.

The basic configuration of an identification trench section 20A of the second wafer 2 is the same as that of the identification trench section 20 of the first wafer 1. However, the arrangement order of each section of the identification trench section 20A is reverse to that of the identification trench section 20. That is, as shown in FIG. 2B, in the state that the bonded surface 10A faces up, the starting trench 21A of the identification trench section 20A is arranged in the rightmost position. Continuously, a type indicating section 22 and further an identification number indicating section 23 are arranged from a trench 23A. The ending trench 21B is arranged in the leftmost position. Since the second wafer 2 is the PD side wafer, a trench 22A is formed in the type indicating section 22. Further, the distance between the starting trench 21A and the ending trench 21B is the same as that of the identification trench section 20, and a range of the identification trench section occupied in the periphery of the wafer body is the same in the first wafer 1 and the second wafer 2.

For each identification trench section, a width (dimension in a surface direction at a periphery of a wafer body) or a depth (dimension in a thickness direction of a wafer body) of a trench can be appropriately set within a range in which a user can recognize the trench visually and accurately. Moreover, when a wafer body becomes thinner after a BG process, etc., the depth of the trench is set not to penetrate the wafer body by the trench in a thickness direction, even when the wafer body is in the thinnest state. When a three-dimensional wiring layer is formed by stacking on the bonded surface of the wafer body, the depth of the trench may be set to stay in a wiring layer and not to reach a silicon part.

Moreover, there is no particular limit to the method of forming a trench. For example, the trench may be formed by laser engraving or etching, etc.

When the first wafer 1 and the second wafer 2 are bonded, and pressing, heating, etc. are performed, in the state that the mutual bonded surfaces 10A face each other, and positioning of electrodes and phase adjusting of the identification trench sections 20 and 20A are performed. Consequently, the electrodes of the first wafer 1 and the electrodes of the second wafer 2 are electrically bonded to be a solid-state imaging device (semiconductor device) 100.

Figure 3:
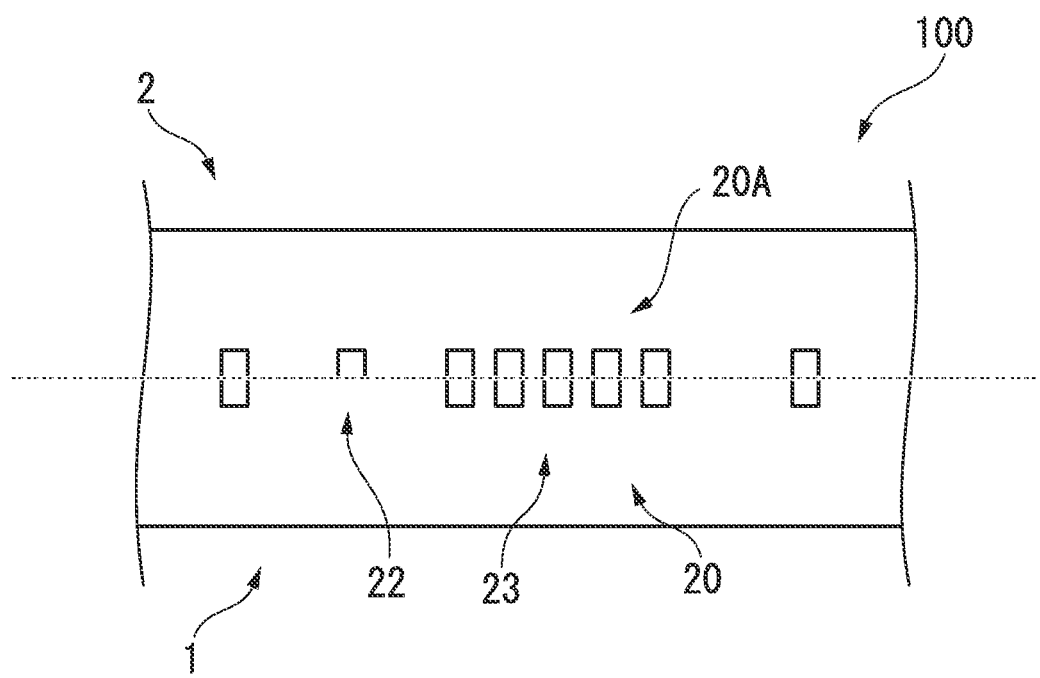
FIG. 3 is a partially enlarged view illustrating a periphery of the semiconductor device that is formed by bonding the first wafer and the second wafer in accordance with the first preferred embodiment of the present invention.

FIG. 3 is a partially enlarged view illustrating a periphery of the solid-state imaging device 100. Since each section of the identification trench section 20A is arranged in reverse to that of the identification trench section 20, after bonding the first wafer 1 and the second wafer 2, a position of each section of the two identification trench sections 20 and 20A coincide with each other.

Accordingly, a user can easily recognize types and identification numbers, etc. of the two bonded semiconductor wafers by merely observing one place of the periphery of the solid-state imaging device 100. In addition, a user can intuitively determine whether the identification number of the first wafer is same as that of the second wafer or not by observing the identification number indicating section 23.

As described above, according to the first wafer 1 and the second wafer 2 in accordance with the preferred embodiment of the present invention, a wafer can be easily identified by checking the periphery even after the two semiconductor wafers are bonded to be a solid-state imaging device 100 because the wafer body 10 has the identification trench section 20 or 20A having trenches opened to the periphery of the wafer body 10.

Moreover, unlike a notch or an oriental flat, etc., since the shape of the wafer body when seen in the thickness direction does not change, troubles such as damage caused due to stress concentration on a part in which the shape has changed hardly occur, and thus damage of the wafer body can be prevented appropriately.

Also, since the identification number indicating section 23 can indicate a number using a plurality of trenches, numerical information about the wafer such as the identification number, etc. can be appropriately indicated.

Further, the depth of a trench of the identification trench section is set not to penetrate the wafer body in the thickness direction thereof. In the case of wafer direct bonding, in order to protect electrodes, etc., after bonding, a resin may be injected into a gap between wafers. However, in the semiconductor wafer of this preferred embodiment, as the trench does not penetrate the wafer body in the thickness direction thereof, the resin does not flow around to the rear surface of the opposite side to the bonded surface through the trench.

Furthermore, when the trench of the identification trench section is formed with a laser or by etching, etc., because the trench can be formed during a manufacturing process of a wiring substrate or a semiconductor device, there is no need to perform processing on an ingot of silicon in advance and thus the process is simple.

In addition, because each of the identification trench sections has the range indicating section 21, a user can accurately understand the range of the identification information, and the range indicating section can be used as an indicator of phase adjusting at the same time.

Furthermore, because the order of each section of the identification trench section 20A of the second wafer 2 bonded to the first wafer 1 is arranged in reverse to that of each section of the identification trench section 20 of the first wafer 1, the arrangement orders of each section of the identification trench sections coincide when bonding. Accordingly, information of the upper and lower semiconductor wafers can be identified in the same manner, so information can be obtained easily and accurately.

In the identification trench section, information other than information described above may be indicated. For example, a lot number or the like serving as a wiring substrate or a semiconductor device can be indicated as a number in the same manner as that of the identification number. At this time, the indicating method is not limited to the aforementioned binary system, that is, another method may be used.

Furthermore, in place of presence or absence of a trench, information may be indicated by the number of trenches or a shape of a trench (V-shaped trench, half-pipe-shaped trench, or the like). Also, by changing a shape of a trench for each section, information indicated by the corresponding trench may be intuitively identifiable.

Further, a plurality of unit areas may be provided on a bonded surface of a semiconductor wafer, and a predetermined semiconductor element and a wiring pattern may be formed on each unit area. In this manner, a plurality of semiconductor devices can be manufactured by cutting the bonded semiconductor wafer for each unit area.

According to the semiconductor wafer and the semiconductor device in accordance with the preferred embodiment of the present invention, it is possible to identify easily a wafer even after wafer direct bonding, and to manufacture as a configuration which is hardly broken.

As used herein, the following directional terms "forward, rearward, above, downward, right, left, vertical, horizontal, below, transverse, row and column" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, unit or part of a device includes hardware and/or software that is constructed and/or programmed to carry out the desired function.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A semiconductor device comprising:
   a first semiconductor wafer having a first plane surface, a second plane surface behind the first plane surface, and a first side surface sharing edges with the first plane surface and the second plane surface; and
   a second semiconductor wafer having a third plane surface, a fourth plane surface behind the third plane surface, and a second side surface sharing edges with the third plane surface and the fourth plane surface,
   wherein the first plane surface is contacted with the third plane surface,
   wherein the first semiconductor wafer has a plurality of first identification trenches, which represents a first property of the first semiconductor wafer,
   wherein the second semiconductor wafer has a plurality of second identification trenches, which represents a second property of the second semiconductor wafer,
   wherein each of the plurality of first identification trenches is opened to the first plane surface and to the first side surface, and has a first depth less than a first thickness of the first semiconductor wafer,
   wherein each of the plurality of second identification trenches is opened to the third plane surface and to the second side surface, and has a second depth less than a second thickness of the second semiconductor wafer,
   wherein, when the first property corresponds to the second property, the plurality of first identification trenches coincide with the plurality of second identification trenches.

2. The semiconductor device according to claim 1,
   wherein the first property is a type of the first semiconductor wafer and numerical information on the first semiconductor wafer, and
   wherein the second property is a type of the second semiconductor wafer and numerical information on the second semiconductor wafer.

3. The semiconductor device according to claim 2,
   wherein the numerical information on the first semiconductor wafer is represented in the binary system according to presence or absence of each trench of the plurality of first identification trenches, and
   wherein the numerical information on the second semiconductor wafer is represented in the binary system according to presence or absence of each trench of the plurality of second identification trenches.

4. A semiconductor device according to claim 1,
   wherein the plurality of first identification trenches is arranged to represent the first property, in one order of a right-hand turn and a left-hand turn, and
   wherein the plurality of second identification trenches is arranged to represent the second property, in the other order of the right-hand turn and the left-hand turn.

* * * * *